United States Patent [19]

Bina

[11] Patent Number: 4,861,277

[45] Date of Patent: Aug. 29, 1989

[54] PRINTED CIRCUIT CARD GUIDE

[75] Inventor: Dale C. Bina, Wheaton, Ill.

[73] Assignees: American Telephone and Telegraph Company, New York, N.Y.; AT&T Information Systems, Inc., Morristown, N.J.

[21] Appl. No.: 274,515

[22] Filed: Nov. 21, 1988

[51] Int. Cl.$^4$ .......................................... H01R 13/629
[52] U.S. Cl. ...................................... 439/377; 211/41
[58] Field of Search ................... 439/64, 377; 361/415; 211/41

[56] References Cited

U.S. PATENT DOCUMENTS 3,197,731 7/1965 Beale et al. ........................... 361/415
3,476,982 11/1969 Bell et al. ............................... 439/64
3,652,899 3/1972 Henschen ............................. 439/377

FOREIGN PATENT DOCUMENTS 2812332 10/1978 Fed. Rep. of Germany ...... 439/377

Primary Examiner—Gary F. Paumen
Attorney, Agent, or Firm—A. A. Tirva

[57] ABSTRACT

A card guide for guiding a circuit card towards a connector mounted on a backplane of electronic apparatus includes a first member which is mounted on the backplane and a second member releasably joined to the first member, the second member having a slot for accommodating an edge of the card for aligning and guiding it towards the connector.

4 Claims, 3 Drawing Sheets

PRINTED CIRCUIT CARD GUIDE

TECHNICAL FIELD

This invention relates to connectors for printed wiring circuit cards located on an electronic equipment backplane and more particularly to an arrangement for guiding the cards toward the connectors.

BACKGROUND OF THE INVENTION

Printed wiring circuit cards and connectors such as edge or Eurocard DIN connectors used to connect the circuitry and devices mounted on the cards to electronic apparatus as well known in the art. In many types of electronic apparatus the connectors are mounted on a panel commonly known as a backplane which accomplishes electrical interconnections between two or more circuit cards. The backplane is in turn secured within and in the back of an apparatus enclosure.

A typical backplane has a plurality of rows of connectors, each row containing at least two connectors with a space in between the connectors. To facilitate insertion and extraction of the circuit cards to and from the connectors, a card guide is mounted on the backplane in the space between each two connectors. Each guide extends from the backplane towards the front of the equipment and has a slot extending the length of the guide along each side adapted to accept an edge of a printed circuit card for guiding the card back towards the connector for insertion of the card into the connector. While this arrangement is completely satisfactory in that it is easy and convenient to insert and extract the cards with the aid of such card guides, cost of manufacturing of the card guides, as well as, cost of assembly of the card guides to the backplanes contributes significantly to the cost of the products using such arrangements. Additionally, when it is necessary to replace two single width cards located in the same row with one double width card, e.g. to improve interbus communications, the card guide located between the two connector positions has to be removed, which is a difficult and time consuming task espcially when the equipment is out in the field.

DISCLOSURE OF THE INVENTION

In accordance with the present invention to overcome the foregoing disadvantages, I provide an improved card guide having two parts, one that is permanently mounted on an equipment backplane near a connector, and the other one which is releasably secured to the part mounted on the backplane being of a length such that it extends from the backplane to the front of the apparatus and having a slot extending its length arranged to accept an edge of a circuit card to align and guide the card towards the connector.

THE DRAWING

DETAILED DESCRIPTION

Figures 1, 2:
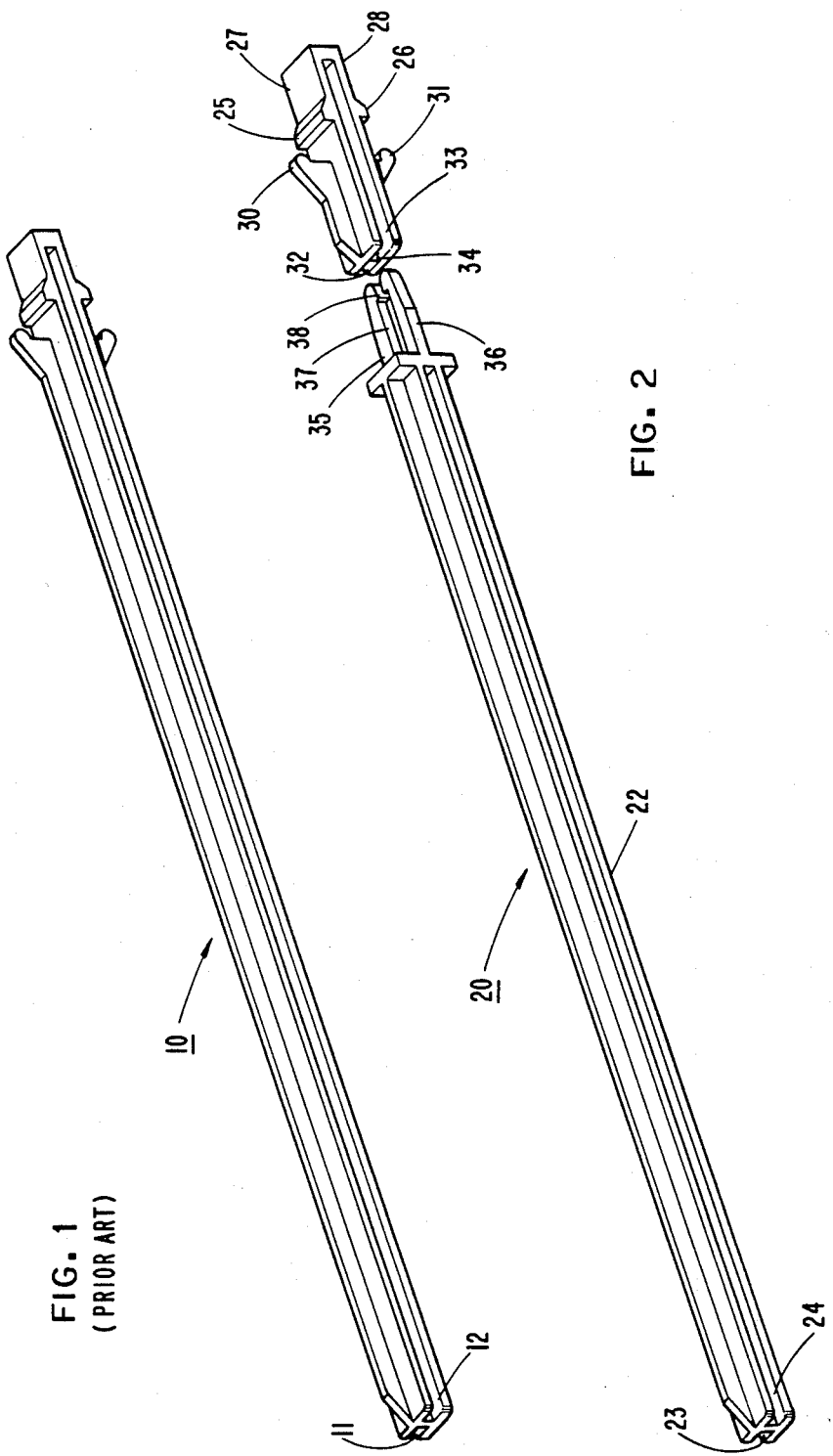
FIG. 1 shows a perspective view of a prior art card guide adapted for mounting on a backplane.
FIG. 2 shows a perspective view of a card guide in accordance with the present invention.

Referring now to FIG. 1, there is shown a prior art one-piece card guide having slots 11 and 12 extending from one end along each of its sides. The other end is adapted for mounting on a backplane upon which a connector is located. Slots 11 and 12 are arranged to accept an edge of a circuit card and guide it towards the connector.

Figure 3:
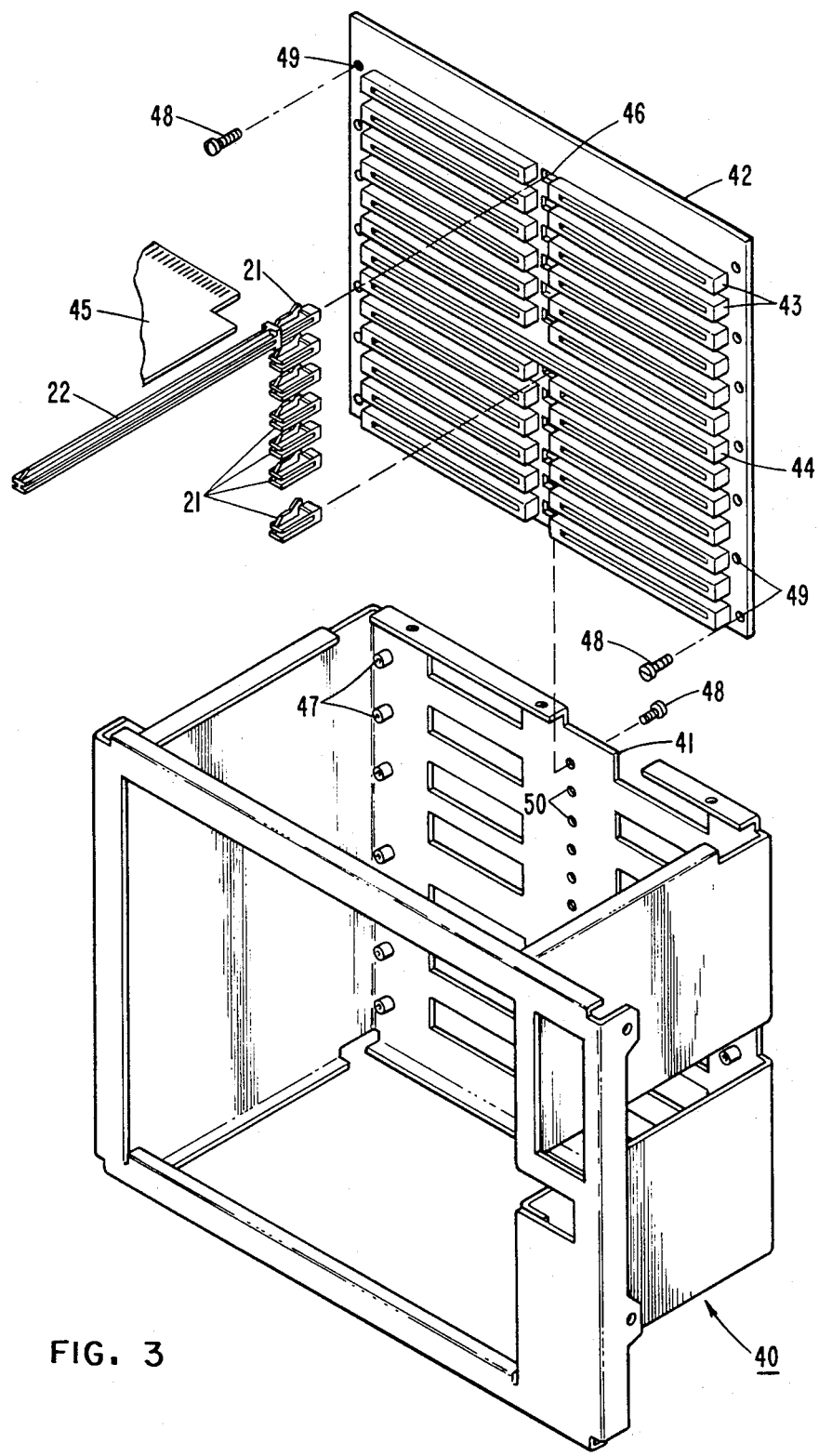
FIG. 3 shows an exploded partial perspective view of an electronic apparatus assembly illustrating a frame, a backplane with connectors, a card guide, and a circuit card.

Referring now to FIGS. 2 and 3, there is shown the preferred embodiment of the invention. FIG. 2 shows a two-piece guide 20 and FIG. 3 shows an electronic apparatus 40 having a frame 41, a backplane 42 with a plurality of single width connectors indicated generally by reference number 43 and one double width connector 44. The two-piece card guide 20 has a short member 21 having one end adapted for mounting on the backplane 42 and a long member 22 having one end adapted for releasably engaging the second end of the short member 21. The long member 22 has slots 23 and 24 extending along its sides from the second end towards the first end. Each of the slots 23 and 24 is wide enough to accept an edge of a circuit card 45 for aligning and guiding the card 45 toward the backplane 42 enabling the card 45 to be plugged into the connector 43.

Figure 4:
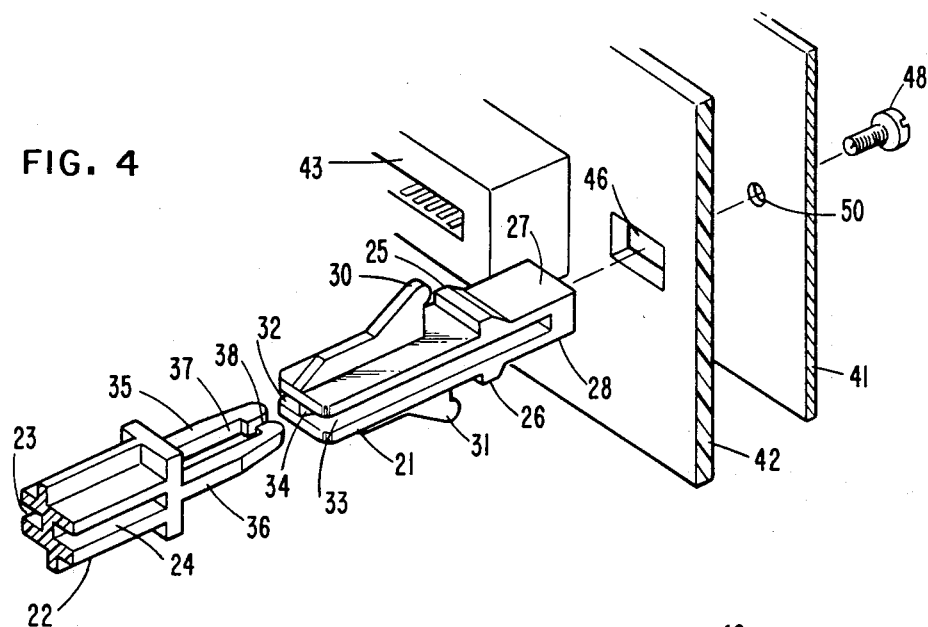
FIG. 4 shows an exploded partial perspective view of the card guide, the backplane and the frame before assembly.

The short member 21 of each guide 20 is inserted into one of the plurality of rectangular openings 46 on the backplane 42, only one opening 46 is shown. The mounting of the short member 21 on the backplane 42 is best illustrated in FIG. 4. Each opening 46 is approximately equal in size to the cross section of the end of each short member 21 to be inserted into the opening. Each short member 21 of the card guide 20 has projections 25 and 26 extending from opposite surfaces 27 and 28 respectively. Surfaces 27 and 28 define an opening 29 through the short member 21. To mount the short member 21 on the backplane 42, the end of the member 21, having a cross section substantially equal to the opening 46, is inserted into the opening 46 unil projections 25 and 26 come up against the backplane 42 and force surfaces 27 and 28 to flex towards each other permitting projections 25 and 26 to pass through the opening 46. Short member 21 continues through the opening 46 until projections 30 and 31, also extending from the surfaces 27 and 28, come up against the backplane 42. The distance between projections 25 and 26 and projections 30 and 31, respctively, is substantially equal to the thickness of the backplane 42 such that member 21 is firmly seated and held in place in the opening 46. The length of the member 21 extending through the opening 46 past the backplane 42 is substantially equal to the length of each of a plurality of stand offs 47 located along the edges of the back of the frame 41. Screws 48 passing through openings 49 in the backplane 42 are used to secure the backplane 42 to the stand offs 47. Screws 48 passing through openings 50 in the frame 41 secure the short members 21 and thus the backplane 42 to the frame 41.

Figure 5:
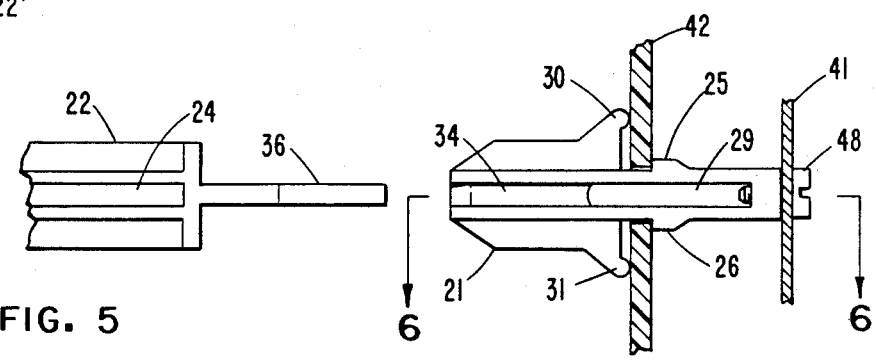
FIG. 5 shows a partial side elevational view of the components shown in FIG. 4 after assembly.
Figure 6:
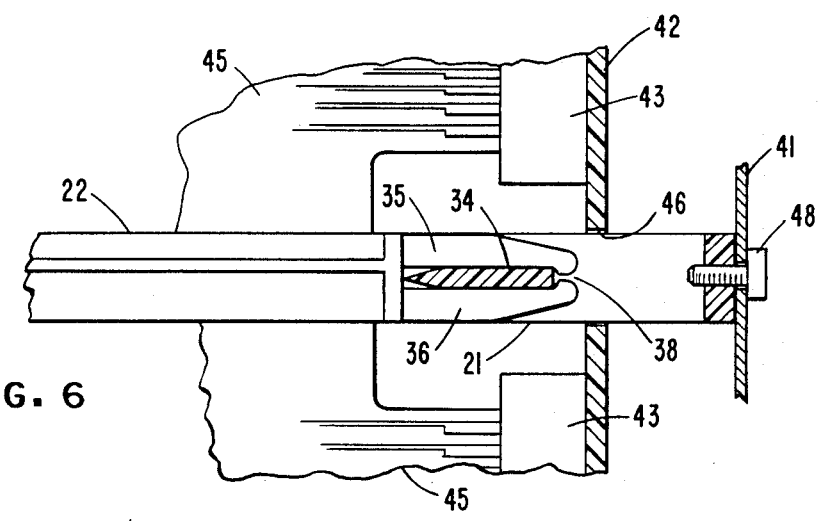
FIG. 6 shows a partial sectional view of the assembly shown in FIG. 5 taken along lines 6—6 of FIG. 5.

The other end of the short member 21 extending from the backplane 42 towards the front of the frame 41 has slots 32 and 33 along its sides separated by a centrally located rib 34 which is best shown in FIGS. 5 and 6. The long member 22 has extending from one of its ends two parallel, flexible fingers 35 and 36. The flexible fingers 35 and 36 enclose an opening 37 with a gap 38 formed by the ends of the fingers 35 and 36. As the ends of members 21 and 22 are brought together, flexible fingers 35 and 36 are accommodated by slots 32 and 33, respectively, and rib 34 enters the opening 37 through the gap 38 by pushing the ends of the flexible fingers 35 and 36 apart. Once the rib 34 is completely within the opening 35, the tips of flexible fingers 35 and 36 return to their normal position locking rib 34 within the opening 37, and thus locking the short member 21 and the long member 22 together. Long member 22 may be separated from the short member 21 by exerting a sufficiently high pulling force along its longitudinal axis such that rib 34 will force the tips of the flexible fingers 34 and 35 apart allowing rib 34 to exit from the opening 37 through the gap 38.

I claim:

1. A card guide for aligning and guiding a circuit card towards a connector mounted on a backplane of an electrical apparatus, the card guide comprising:

a first member having a first end arranged for mounting on a backplane such that a second end extends away from the backplane and is substantially perpendicular to it;

a second member having a slot extending longitudinally from its first end along one of its sides substantially the length of the second member, the slot having a width to slidably accommodate an edge of the circuit card; and means for releasably joining said first and second members such that the first and second members are aligned coaxially, said joining means comprising:

a pair of flexible fingers extending from the second end of the second member, the flexible fingers forming a substantially rectangular opening with an inlet to the opening formed by the tips of said fingers;

a pair of grooves extending from the second end of the first member, the grooves arranged to slidably receive the flexible fingers; and a rib separating said grooves of the first member, the rib having a cross sectional area with dimensions such that it passes through the inlet by forcing apart the tips of the flexible fingers until the rib is completely within the rectangular opening.

2. A card guide in accordance with claim 1 wherein the backplane includes an aperture for receiving the first end of the first member such that a predetermined portion of the first member extends through the backplane.

3. A card guide in accordance with claim 2, wherein further includes a first set of tabs extending from opposite surfaces of the first member, the opposite surfaces being separated by an opening, which allows the opposite surfaces to move towards each other allowing the first set of tabs to pass through the aperture in the backplane; and a second set of tabs extending from the opposite surfaces, the distance between each first and second tab being substantially equal to the thickness of the backplane, the second set of tabs being of sufficient height to prevent further passage of the first member through the aperture in the backplane.

4. A card guide in accordance with claim 3 which further includes means for securing the first portion of the first member projecting through the backplane to the electrical apparatus.

* * * * *